United States Patent [19]
Dorney

[11] Patent Number: 5,732,030
[45] Date of Patent: Mar. 24, 1998

[54] METHOD AND SYSTEM FOR REDUCED COLUMN REDUNDANCY USING A DUAL COLUMN SELECT

[75] Inventor: Timothy D. Dorney, Houston, Tex.

[73] Assignee: Texas Instruments Incorporated, Dallas, Tex.

[21] Appl. No.: 681,201

[22] Filed: Jul. 22, 1996

Related U.S. Application Data

[60] Provisional application No. 60/020,375, Jun. 25, 1996.
[51] Int. Cl.$^6$ .................................................. G11C 13/00
[52] U.S. Cl. ........................ 365/200; 365/210; 365/230.1
[58] Field of Search .......................... 365/230.01, 200, 365/210

[56] References Cited

U.S. PATENT DOCUMENTS

| | | | |
|---|---|---|---|
| 4,389,715 | 6/1983 | Eaton, Jr. et al. | 365/200 |
| 4,392,211 | 7/1983 | Nakano et al. | 365/200 |
| 5,060,197 | 10/1991 | Park et al. | 365/200 |
| 5,270,975 | 12/1993 | McAdams | 365/200 |
| 5,576,633 | 11/1996 | Rountree | 326/10 |

OTHER PUBLICATIONS

"Laser Programmable Redundancy and Yield Improvement in a 64 K Dram" by Robert T. Smith, James D. Chlipala, John F.M. Bindels, Roy G. Nelson, Frederick H. Fischer and Thomas F. Mantz, 1981 IEEE.

*Primary Examiner*—Terrell W. Fears
*Attorney, Agent, or Firm*—Robert N. Rountree; Leo N. Heiting; Richard L. Donaldson

[57] ABSTRACT

A semiconductor memory device (10) includes a plurality of row address inputs (RA0–RA8), and a plurality of column address input (CA0–CA8) lines. A plurality of main memory subarrays (122) include a plurality of memory cells (122). A plurality of redundant memory arrays are associated with the main memory arrays. Column redundancy circuitry (68) receives column addresses (CA3–CA7) for determining if a match occurs between the received column addresses and the stored redundant column information.

30 Claims, 10 Drawing Sheets

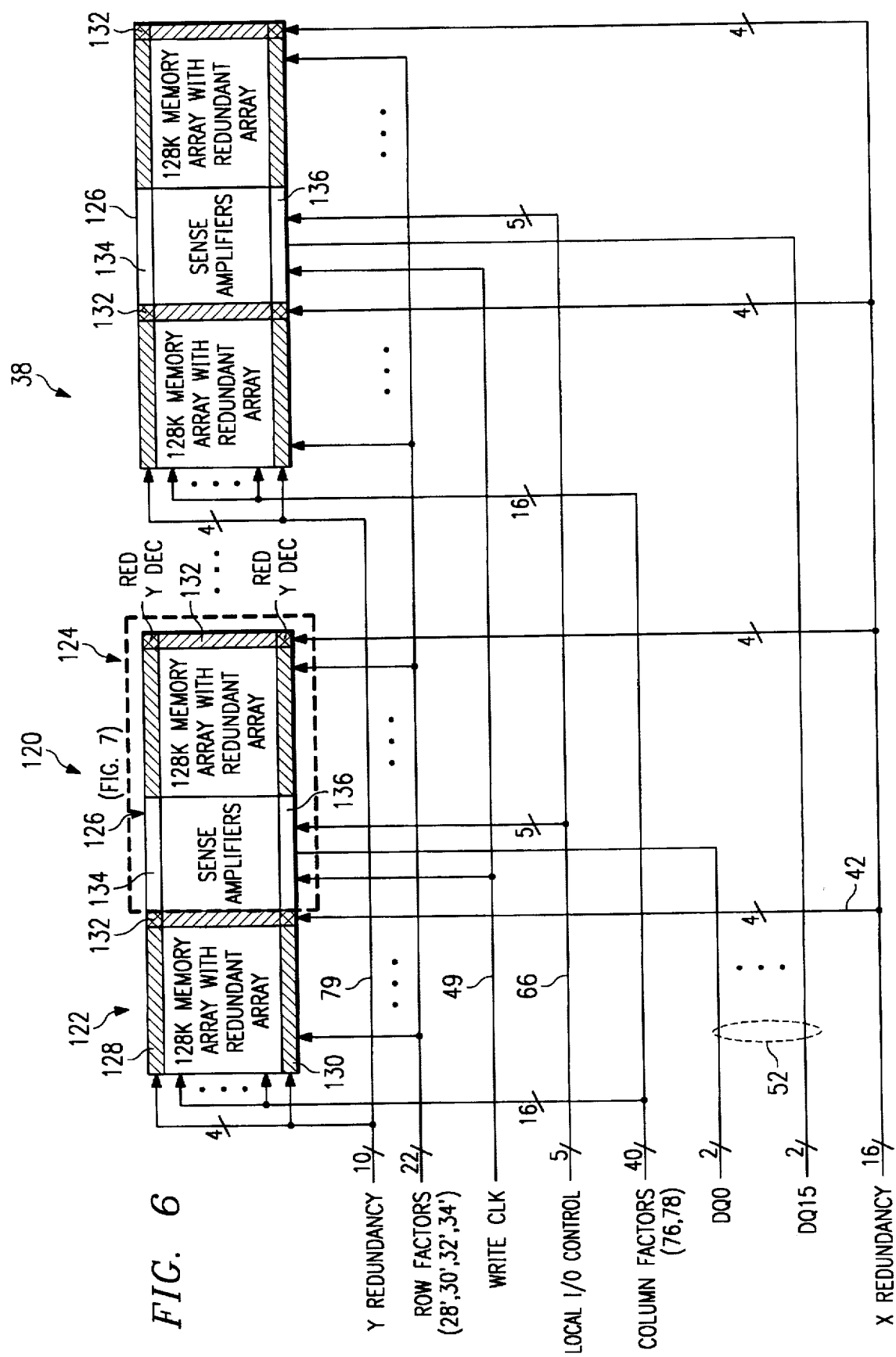

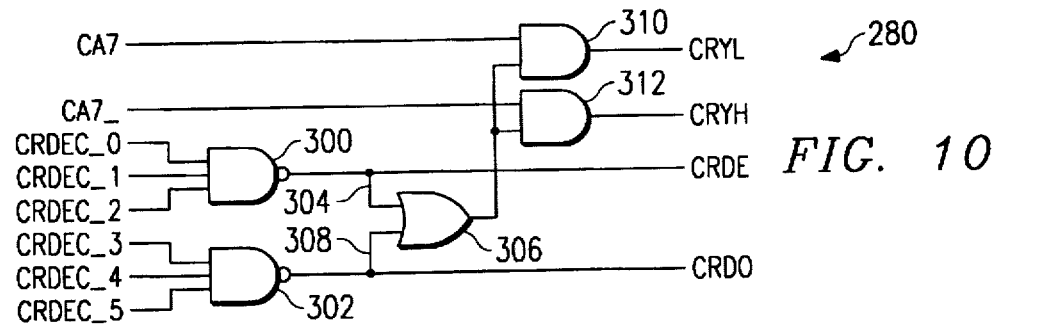
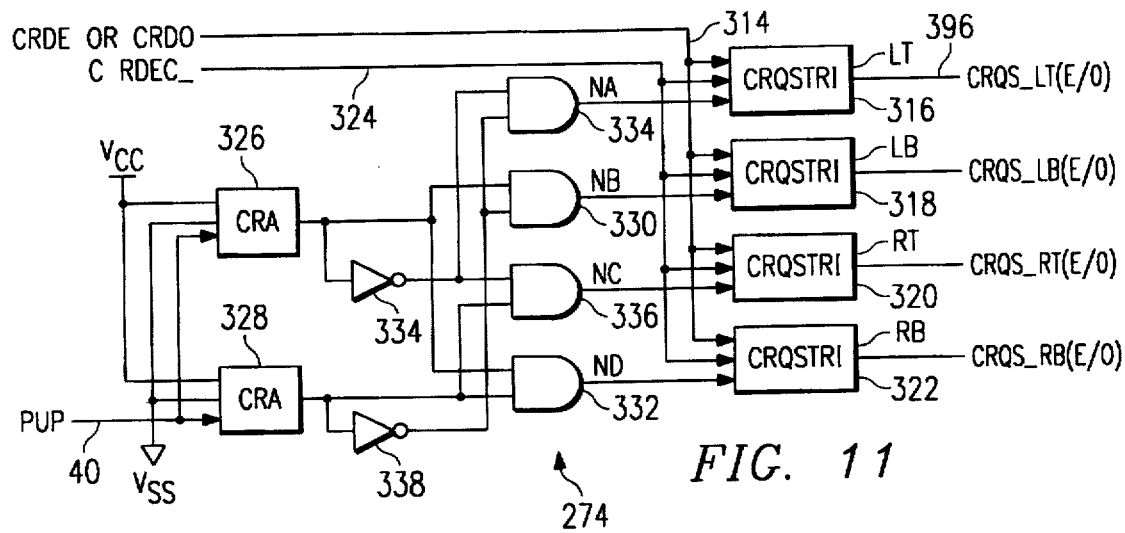
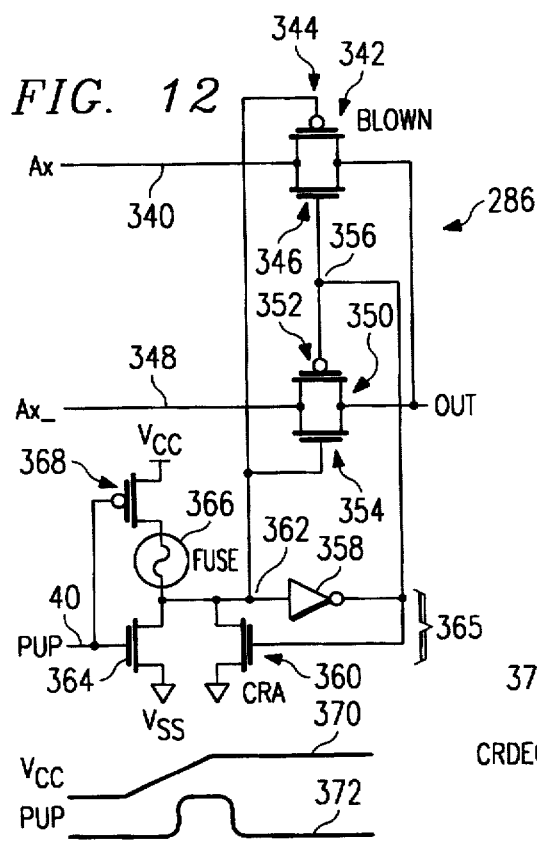
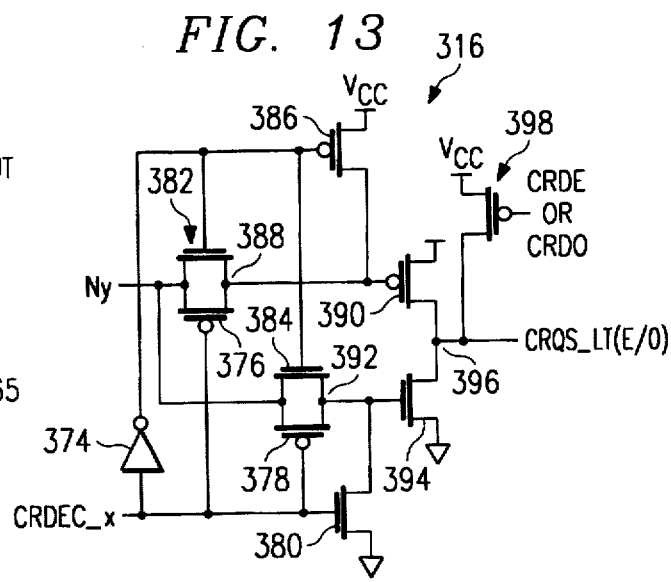
FIG. 10
FIG. 11
FIG. 12
FIG. 13

| RF0–RF3 | RAx | RAw | RAv | RFy | |
|---|---|---|---|---|---|
| | $\overline{RA1}$ | $\overline{RA0}$ | | RF0 | |
| | $\overline{RA1}$ | RA0 | | RF1 | 1 of 4 wordlines selected |
| | RA1 | $\overline{RA0}$ | | RF2 | |
| | RA1 | RA0 | | RF3 | |
| RF4–RF11 | $\overline{RA4}$ | $\overline{RA3}$ | $\overline{RA2}$ | RF4 | |
| | $\overline{RA4}$ | $\overline{RA3}$ | RA2 | RF5 | |
| | $\overline{RA4}$ | RA3 | $\overline{RA2}$ | RF6 | |
| | $\overline{RA4}$ | RA3 | RA2 | RF7 | |
| | RA4 | $\overline{RA3}$ | $\overline{RA2}$ | RF8 | |
| | RA4 | $\overline{RA3}$ | RA2 | RF9 | |
| | RA4 | RA3 | $\overline{RA2}$ | RF10 | |
| | RA4 | RA3 | RA2 | RF11 | |
| | | | | | 1 of 64 decoders selected |
| RF12–RF19 | $\overline{RA7}$ | $\overline{RA6}$ | $\overline{RA5}$ | RF12 | |
| | $\overline{RA7}$ | $\overline{RA6}$ | RA5 | RF13 | |
| | $\overline{RA7}$ | RA6 | $\overline{RA5}$ | RF14 | |
| | $\overline{RA7}$ | RA6 | RA5 | RF15 | |
| | RA7 | $\overline{RA6}$ | $\overline{RA5}$ | RF16 | |
| | RA7 | $\overline{RA6}$ | RA5 | RF17 | |
| | RA7 | RA6 | $\overline{RA5}$ | RF18 | |
| | RA7 | RA6 | RA5 | RF19 | |
| RF20–RF21 | $\overline{RA8}$ | | | RF20 | |
| | RA8 | | | RF21 | |

*FIG. 17*

METHOD AND SYSTEM FOR REDUCED COLUMN REDUNDANCY USING A DUAL COLUMN SELECT

RELATED APPLICATION

This application claims priority under 35 USC §119(e)(1) to provisional application number 60/020,375, filed Jun. 25, 1996, now abandoned.

TECHNICAL FIELD OF THE INVENTION

The present invention relates to electronic memory devices and, more particularly, to a method and system for providing reduced column redundancy in a memory device array using a dual column select function.

BACKGROUND OF THE INVENTION

A semiconductor device includes a large number of memory cells arranged along rows and columns which are orthogonal to each other. The density of defects generated in such a semiconductor memory device during manufacturing is relatively independent of the integration density of the device, but is dependent on the semiconductor manufacturing technology. The higher the integration density of the device, the greater is the ratio of the number of normal memory cells to that of defective memory cells. This is one of the advantages obtained by increasing the integration density of a semiconductor memory device. Even if the device, however, includes only one defective memory cell therein, the device cannot operate normally, and therefore, the device is abandoned.

In order to be able to operate a semiconductor device despite such a defective memory cell, a semiconductor memory device incorporates a redundant memory cell array in the main memory cells array along the rows and columns. In this device, when a defective memory cell is detected, the redundancy memory cell array is used instead of a row memory cell array or a column memory cell array. In a semiconductor memory device including such a redundancy memory cell array, the manufacturing yield can be improved.

The conventional semiconductor memory device including a redundancy memory array provides a way to compare all or part of the external address with the address information of the location of defective row or column memory arrays. When such a match between the external address and the defective address is made, the redundancy memory array is used in place of the normal main memory array.

The external address, such as the column address information being given from external terminals, is supplied to both the column factors and the column redundancy decoders from the column address buffers. The column factors group the column addresses such that one output signal from each group is at a unique state from all the other signals in that group. The column redundancy decoders are a set of decoders which contain information of the defective columns in the normal memory array. If no match is made between the address from the address buffers and the column redundancy decoders, the column factors fire and select the appropriate normal column memory array. If, however, a match exists between the address from the column address buffers and the defective column information in the column redundancy decoders, a coincident signal generated from the column redundancy decoders prevents the column factors from firing. Instead, the column redundancy decoders also fires a signal to select the redundant column memory array.

Even though redundancy methods and organization are well established in the state of the art, several considerations must be made when evaluating high speed memory architectures.

In conventional memory organizations, sense amplifiers are arranged to sense the state of the data stored in the memory cells. A bank of multiple sense amplifiers is arranged in each memory array to sense, amplify and restore the data on an entire selected row. One or more of these sense amplifiers are selected by the active Y-select (i.e. column select) to connect, through a local bus, with a mid-amplifier. The mid-amplifier can transmit the received data to the output amplifiers near the external terminals, or it can overwrite the data in the storage cell(s) through the sense amplifier(s). In this fashion, a read or write cycle, respectively, can be performed.

The sense amplifiers are organized in groups. Each sense amplifier in the group is associated to one, individual local I/O line pair. Multiple sense amplifiers are associated with the same local I/O line, but only one sense amplifier will be selected to connect to a particular local I/O line as determined by which Y-select fires. To improve bandwidth, the number of sense amplifiers which are accessed during a cycle is increased. This means that the number of sense amplifiers connected to a Y-select increases and the number of local I/O lines needed to service the sense amplifiers must also increase. This creates a problem when column redundancy is considered.

Traditional methods for providing column redundancy is to create a duplicate of the sense amplifiers and information cells used in the normal memory array. For example, a single Y-select is connected to eight sense amplifiers which are associated to eight pairs of local I/O lines. If a defective memory location exists, a redundant Y-select is fired while the normal Y-select is prevented from firing. The redundant memory array, as required by the organization, will have eight redundant sense amplifiers organized similarly to the normal sense amplifiers. The redundant column memory array requires an equal silicon area to the normal memory array silicon area for that Y-select.

As the number of sense amplifiers that are controlled by a single Y-select increase, the silicon area required for the redundant area is a substantially larger portion of the silicon area used of the device. To further aggravate the problem, multiple redundant Y-selects are required to adequately improve yield.

SUMMARY OF THE INVENTION

In accordance with the present invention, a method and system for providing reduced column redundancy in a memory device is presented that substantially reduces or eliminates problems associated with previously developed redundancy methods and organizations for semiconductor memory devices.

The present invention, accordingly, provides a semiconductor memory device that includes a plurality of row address input lines that receive a plurality of row address signals from an external source. A plurality of column address input lines receive a plurality of column address signals from the external source. In addition, a plurality of main memory arrays include a plurality of main memory subarrays. The main memory subarrays include a plurality of memory cells configured into a plurality of memory cell rows and a plurality of memory cell columns. A plurality of redundant memory arrays associate with the main memory arrays. The redundant memory arrays include a plurality of redundant rows of memory cells and a plurality of redundant columns of memory cells. Row address circuitry of the present invention associates with the row address input lines for receiving the plurality of row addresses and generating therefrom a plurality of row factors that associate with a specified one of the plurality of memory cell rows. The row address circuitry includes decode circuitry for decoding the row factors and firing an X-select signal. The row address circuitry further includes row redundancy circuitry for receiving a plurality of row addresses for determining if a match occurs between the received row addresses and the redundant decoder information which, when a match occurs, generates therefrom a signal to prevent the row factors from firing a normal X-select and a redundant row factor that associates a specified one of the plurality of redundant rows. The redundant decoder circuitry decodes the redundant row factor to fire a redundant X-select.

Column address circuitry associates with the column address input lines for receiving the plurality of column addresses and generating therefrom a plurality of column factors for associating with a specified two of the plurality of memory cell columns. The column address circuitry includes decode circuitry for decoding the column factors, from which some of the column factors are split to provide an even and an odd column factor, and firing two Y-select signals of which one is an even type and one is an odd type. The column address circuitry further includes column redundancy circuitry for receiving a plurality of column addresses for determining if a match occurs between the received column addresses and the redundant column decoder information which, when a match occurs, generates therefrom a signal to prevent at least one of the odd or even column factors from firing and that associates with a specified one of the plurality of redundant columns. The redundant decoder circuitry decodes the redundant column signal to fire a redundant Y-select of the same odd or even type as the main memory Y-select which has been disabled. As more than one redundant column decoder can be active at a time, one or both of the main memory column Y-selects can be replaced with redundant column Y-selects of the same type. The Y-selects determine which of the plurality of sense amplifiers are connected to local input/output lines to write or read data. The present invention further includes a grouping of the local input/output lines to which the sense amplifiers are associated and arranged so that even Y-selects allow their associated sense amplifiers to connect to the even local input/output lines and the odd-Y selects allow their associated sense amplifiers to connect to odd local input/output lines. This concept is further extended to allow both an even and an odd redundant Y-select to associate with the same redundant sense amplifiers to allow the redundant sense amplifiers to connect to both the even and odd local input/output lines, of which only one even or odd redundant Y-select connected to the the redundant sense amplifiers will ever be operated, but is not predetermined until the stored redundant address information is determined.

A technical advantage of the present invention is the ability to fire two Y-select or column select signals at a time in the same segment of a memory array. This provides the same amount of repairability with a reduced number of sense amplifiers required to the redundant memory portion of a memory array.

Another technical advantage of the present invention is an architecture that provides reduced sense amplifiers as compared with the known single column select architectures. This results in silicon savings to yield a higher chip-per-wafer count. The present invention requires minimal change in the sense amplifier structure between normal and redundant sense amplifiers in order to achieve the technical advantages of a dual redundant column select.

Since the ability to fire two-Y-select signals exists, this improves the ability to store and retrieve information in and out of the memory during a single cycle of operation. This makes possible a faster device because a greater number of sense amplifiers provide information at a time with the architecture of the present invention.

BRIEF DESCRIPTION OF THE DRAWINGS

A more complete understanding of the present invention and advantages thereof may be acquired by referring to the following description taken in conjunction with the accompanying drawings in which like reference numbers indicate like features and wherein:

FIG. 6 illustrates in detailed block diagram format the main and redundant memory matrix circuitry of the present invention;

FIG. 10 provides a logic circuit diagram for the column redundant Y-select (CRY) circuit of FIG. 8;

FIG. 11 provides a logic circuit diagram for one embodiment of the column redundant quadrant specific (CRQS) block of FIG. 8;

FIG. 12 depicts a logic circuit diagram for one embodiment of the column redundant address (CRA) circuit of FIG. 8; and FIG. 13 provides a logic circuit diagram for one embodiment of the CRQSTRI circuit component of FIG. 11;

FIG. 17 provides a truth table illustrating the generation of the different row factors.

DESCRIPTION OF THE PREFERRED EMBODIMENT

Figure 1:
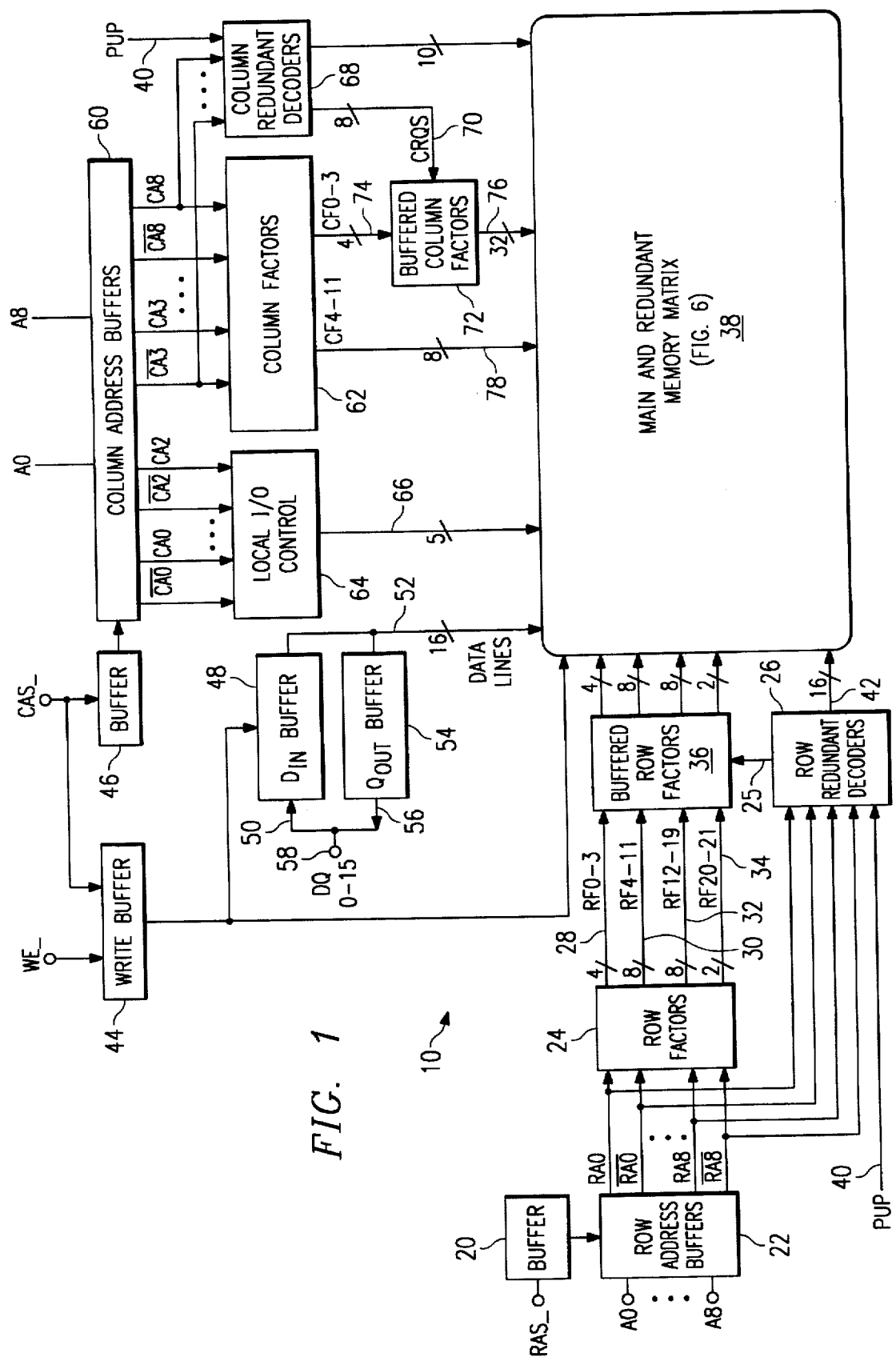
FIG. 1 provides a schematic block diagram of a memory circuit formed according to the present embodiment of the invention.

Referring to FIG. 1, there is shown a block diagram of a semiconductor memory device which is a 4,194,304 (=2^22)

bit dynamic MOS RAM (which is an abbreviation for random access memory). The present invention has application to essentially any semiconductor memory device capable of employing its unique architecture, including such well known memory devices as DRAM, SDRAM, VRAMs, SRAMs, EPROMs, and flash EPROMs. The memory device includes sixteen main memory arrays of which only two are shown. The other fourteen are represented by a series of dots located between the arrays. Furthermore, these sixteen arrays are organized into four groups of four arrays to form four quadrants.

The schematic block diagram of FIG. 1 shows memory circuit 10 to include row address signal, RAS_, which enters buffer 20. Output from buffer 20 goes to row address buffers 22 which receive addresses A0 through A8. Row address buffers 22 latch and invert the row address to generate true row addresses RA0 through RA8 and inverted row addressed $\overline{RA0}$ through $\overline{RA8}$. Row factors circuit 24 receives row addresses RA0 and $\overline{RA0}$ through RA8 and $\overline{RA8}$, as does row redundant decoders circuit 26. Row factors circuit 24 generates twenty-two row factors, RF0 through RF21, and groups them so that RF0 through RF3 travel along lines 28, RF4 through RF11 travel along lines 30, RF12 through RF19 travel along lines 32, and RF20 and RF21 travel along lines 34.

Buffered row factors circuit 36 receives row factors RF0 through RF21 from row factors circuit 24 and sends them to the main memory. Memory matrix 38 contains both the main memory and the redundant memory arrays. Only one factor in the group is high in each of the four factor groups. The high factor signal in each of the factor groups is uniquely associated to the provided external row address. Buffered row factors circuit 36 sends the row factors to all four quadrants of the main memory.

TABLE 1, which appears following the FIGUREs, provides the values for the row factors and their logical interpretation by the present invention.

TABLE 1 shows the row address and inverted row address from row factors RF0 through RF21 that were formed into four groups of factors, RF0 through RF3, RF4 through RF11, RF12 through RF19, and RF20 through RF21. Each row decoder attaches only to one factor from each group of row factors. When all of those lines are high, then the connected decoder circuit component fires. But the connections on all of the other decoders are different, so that they will not fire. This is because only one factor in each of the four groups can be high at a single time.

Returning to FIG. 1, column address signal, $\overline{CAS}$, goes to the write buffer 44 and buffer circuit 46. Write buffer 44 also receives write enable signal, $\overline{WE}$. Write buffer circuit 44 provides input to $D_{IN}$ buffer 48, as does DQ input 50. $D_{IN}$ buffer 48 represents the 16 input buffers used for DQ0–15. Main and redundant memory matrix 38 provides output to $Q_{OUT}$ buffer circuits 54 which, via line 56, provide DQ output at node 58. $Q_{OUT}$ buffer 54 represents the 16 output buffers used for DQ0–15.

Figure 8:
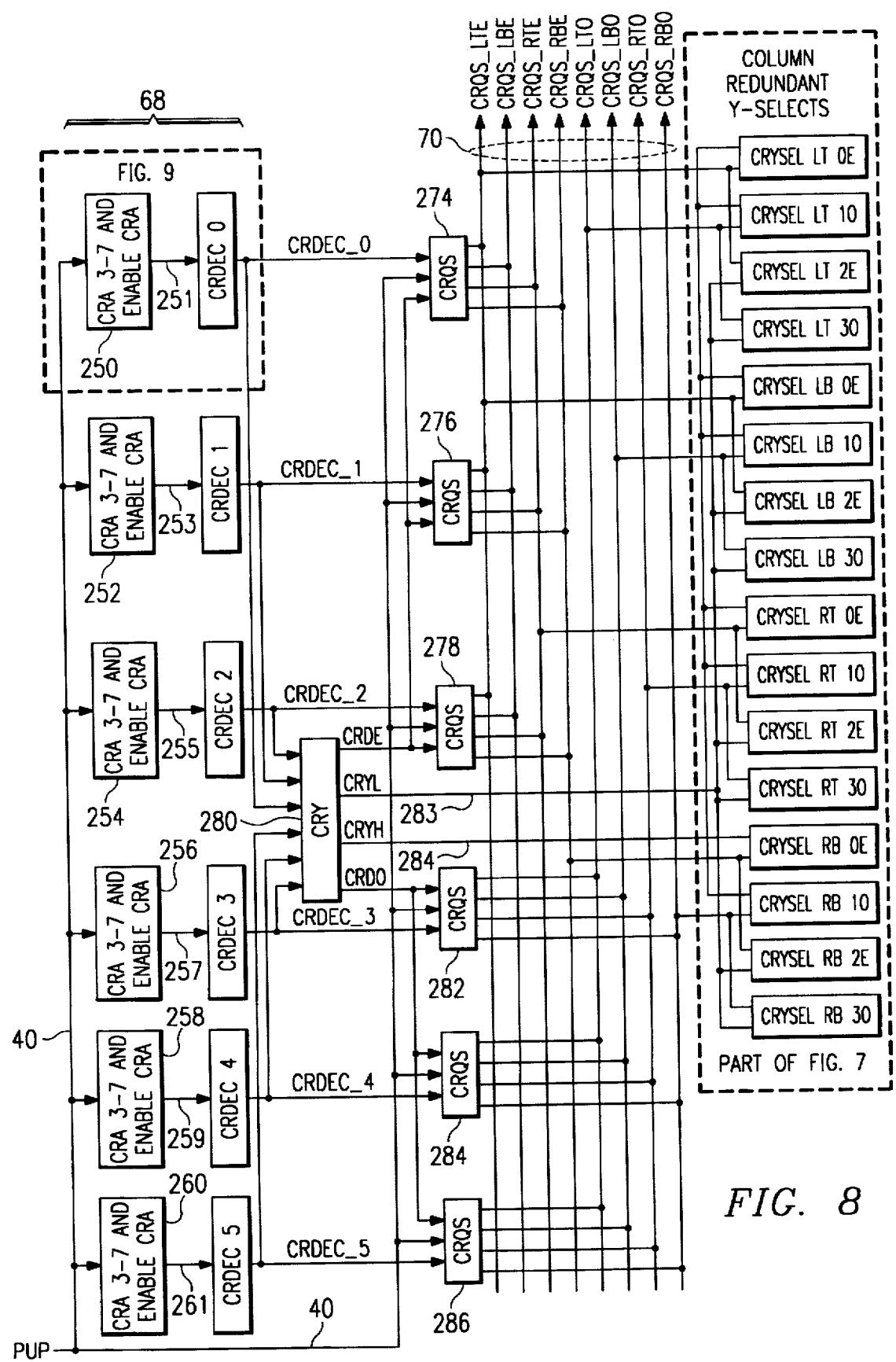
FIG. 8 depicts in yet further detail the column redundant quadrant select (CRQS) signal generation circuits and redundant Y-select circuits of the present invention.

Buffer circuit 46 provides input to column address buffers 60 which also receives addresses A0 through A8. Column address buffers 60 provides column addresses $\overline{CA3}$ and CA3 through $\overline{CA8}$ and CA8 to column factors circuit 62. Column addresses $\overline{CA0}$ and CA0 through $\overline{CA2}$ and CA2 go to local I/O control circuit 64. Local I/O control circuit 64 provides output via line 66 to main and redundant memory matrix 38. Column addresses $\overline{CA3}$ and CA3 through $\overline{CA8}$ and CA8 also go to column redundant decoder circuit 68, as does pull-up pulse (PUP) signal 40. The waveforms for PUP are shown below FIG. 12. Column redundant decoder circuit 68 provides input via lines 70 to the buffered column factors circuit 72, which receives column factors CF0 through CF3 via line 74. The operation and circuitry is described in more detail through the figures below and their accompanying text. Buffered column factors circuit 72 provides buffered column factors via lines 76 to main and redundant memory matrix 38. Column factors circuit 62 provides column factors CF4 through CF11 via lines 78 to main and redundant memory matrix 38. FIG. 8 and its accompanying text describe in further detail the operation of the column redundant Y-select features of the present embodiment.

Buffered column factors circuit 72 and buffered row factors circuit 36 control turning off the normal column and row factor pathways to permit redundant memory cells to store data. Buffered column factors circuit 72 receives the normal column factors, and CRQS lines 70 determines whether there is a redundancy match to prohibit firing along a normal pathway.

If one of the signals in one group of factors is low, all normal Y-selects will be kept low. For this reason, although there are twelve lines going into and out of column factors circuit 62, eight of them are allowed to pass unaltered. Four of them go through buffered column factors circuit 72, which allows the CRQS lines 70 to turn these normal factors off.

The column logic of the present invention is to fire two Y-selects in every cycle. In FIG. 1, column address buffers circuit 60 latches the column address at the fall of $\overline{CAS}$. Column addresses CA3 and $\overline{CA3}$ through CA8 and $\overline{CA8}$ are latched to be used directly by the Y-select decode circuitry (see FIGS. 2 through 5). CA0 and CA1 are used to select which local I/O lines should be connected to the mid-amplifiers, and CA2 determines which mid-amplifiers should be connected to the data lines which lead to the output buffers (see FIG. 7). All of the external column addresses go through column address buffer circuit 60 to be buffered and inverted to provide the true and inverted column address.

The buffered true and inverted column addresses go to both the column factor generator circuit 62 and column redundancy logic 68. Column factor logic circuit 68 groups the column addresses such that only one factor in the group is high in each of the factor groups. The high factor signal in each of the factor groups is uniquely associated to the external column address provided. Column factors CF4 through CF11 are then sent to the four quadrants in the memory array. Column factors CF0 through CF3 are sent to the buffered column factors block 72, where they are split into even and odd factors and buffered for each of the four quadrants (see FIG. 5).

The local I/O control lines are comprised of five lines to control the connection between each of the sets of local I/O lines near the sense amplifiers and the mid-amplifiers, and to control which of the two mid-amplifiers connect to the differential DQ(0–15) lines 52. The four to one multiplexers created by the two sets of four passgate pairs between the two sets of differential local I/O lines and the two mid-amplifiers are controlled by the four lines (see FIG. 7). The remaining line controls the mid-amplifier connection to access data through the DQ lines 52.

Column addresses zero and one determine which one of the four local I/O line pairs is allowed to connect to the mid-amplifier for both sets of local I/O lines. Column address two determines which of the two mid-amplifiers is connected to the differential data lines to drive the external data terminal.

When a normal memory access is desired, an X-select becomes active according to the external row address provided. All of the sense amplifiers in the bank, sense, amplify and restore the data which was made available from the selected row in the memory array. After the data has been sensed by the sense amplifiers, two Y-selects, as determined from the external column address, fire to connect eight total sense amplifiers to the eight local I/O pairs. The even Y-select that fires connect four sense amplifiers to group #1 of the local I/O pairs. The odd Y-select that fires connects four sense amplifiers to group #2 of the local I/O lines pairs. Column addresses CA0 and CA1 select one of the four local I/O line pairs in each group to connect with the mid-amplifier. Column address CA2 selects between the two mid-amplifiers to connect to the differential data lines.

Due to the advantageous organization of the column memory array, the column redundancy requires less area to provide sufficient redundancy. When a defective column memory cell has been detected, all eight of the sense amplifiers do not have to be replaced by the eight redundant sense amplifiers. The Y-selects have split to control different sense-amplifier-to-local I/O line group connections. The defective memory locations may only be a single location, group of locations within the boundary of the four sense amplifiers, or crossing the boundary between two or more sets of four sense amplifiers. If one of the first two cases are true, only one of the normal Y-selects needs to be replaced by an appropriate redundant Y-select. In this case, whenever the defective memory location is attempted to be accessed, a redundant Y-select which is connected to the same group of local I/O lines will fire in place of the Y-select which had the defective location(s), and the normal Y-select which is from the other local I/O line group will also fire. This allows the redundant Y-select which is not used in this case to be programmed to some other normal Y-select which has a defective memory location, so long as that redundant Y-select connects to the same group of local I/O lines as the normal Y-select. In the latter case, where the defect occurs across a boundary of four grouped sense amplifiers, both of the redundant Y-selects will be required to replace the two normal Y-selects.

Given the possibility that no repair is necessary and these cases where defects are present, the device may have two normal Y-selects fire, one normal and one redundant Y-select fire, or two redundant Y-selects fire at the same time.

For the row term on circuit, if none of the row redundant decoder sets signal 25 fires, then after some delay when RAS falls, the buffered row factors block 36 will turn on the row factor generator. If the row redundant decoder sets signal 25 fires, then the buffered row factors block 36 will not be allowed the to fire. This will prevent the normal row factors from firing. The redundant row decoder controlled by the decoder set which had the match will fire instead of the normal row decoder.

Figures 2, 3, 4:
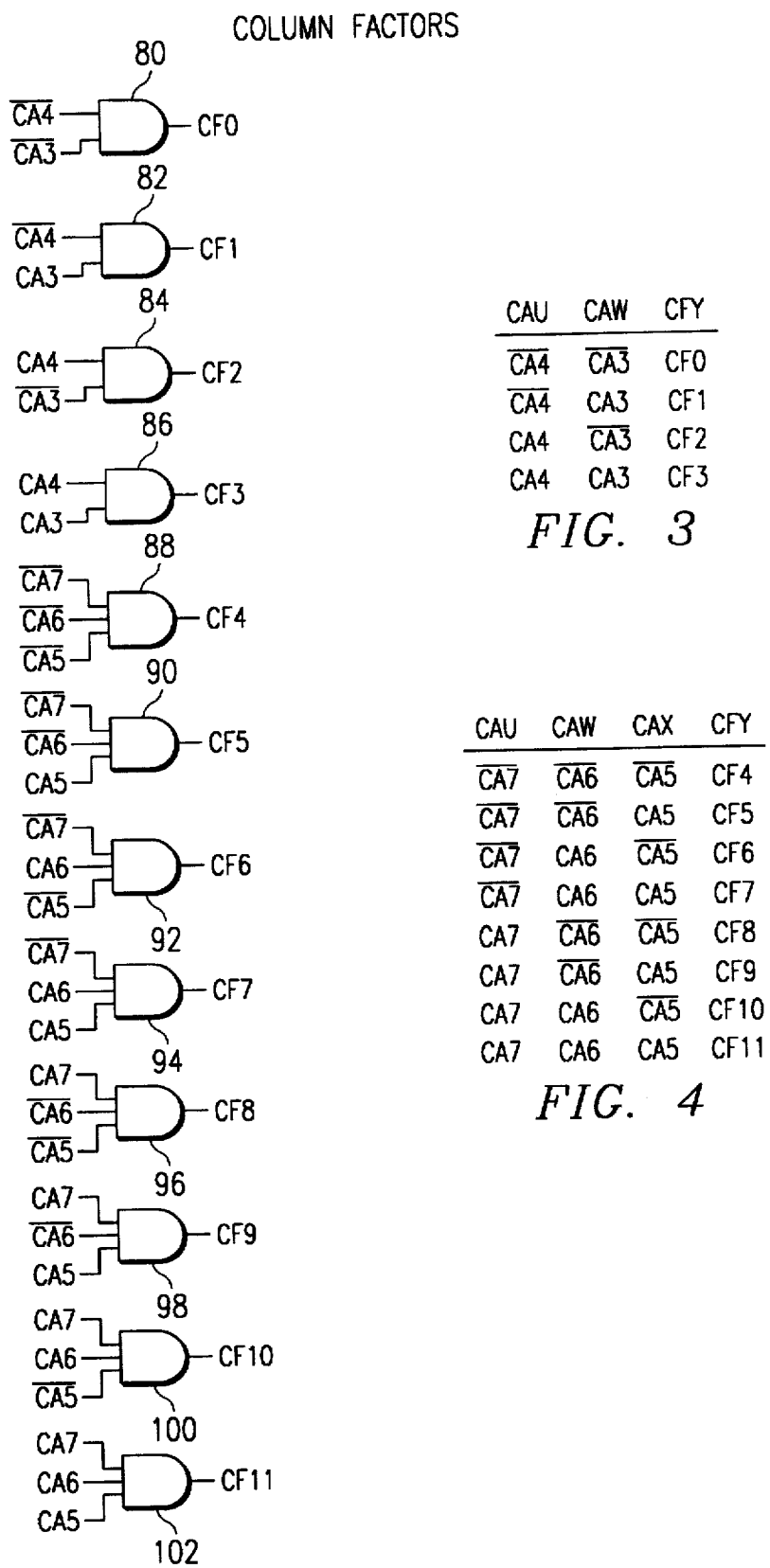
FIG. 2 depicts the formation of column factors in response to column address inputs, which column factors serve as inputs to the main memory matrix of the present invention.
FIGS. 3 and 4 are truth tables illustrating the generation of the different column factors of FIG. 2.

FIGS. 2 through 4 illustrate the logical operations that occur to generate column factors CF0 through CF11. Thus, column addresses $\overline{CA4}$ and $\overline{CA3}$ enter AND gate 80 to produce column factor CF0. Column factors $\overline{CA4}$ and CA3 enter and gate 82 to produce column factor CF1. These operations continue as AND gates 84 through 102 indicate to yield the results that the truth tables of FIGS. 3 and 4 describe. These outputs go, respectively, to buffered column factor circuit 72 or directly to main and redundant memory matrix 38.

Figure 5:
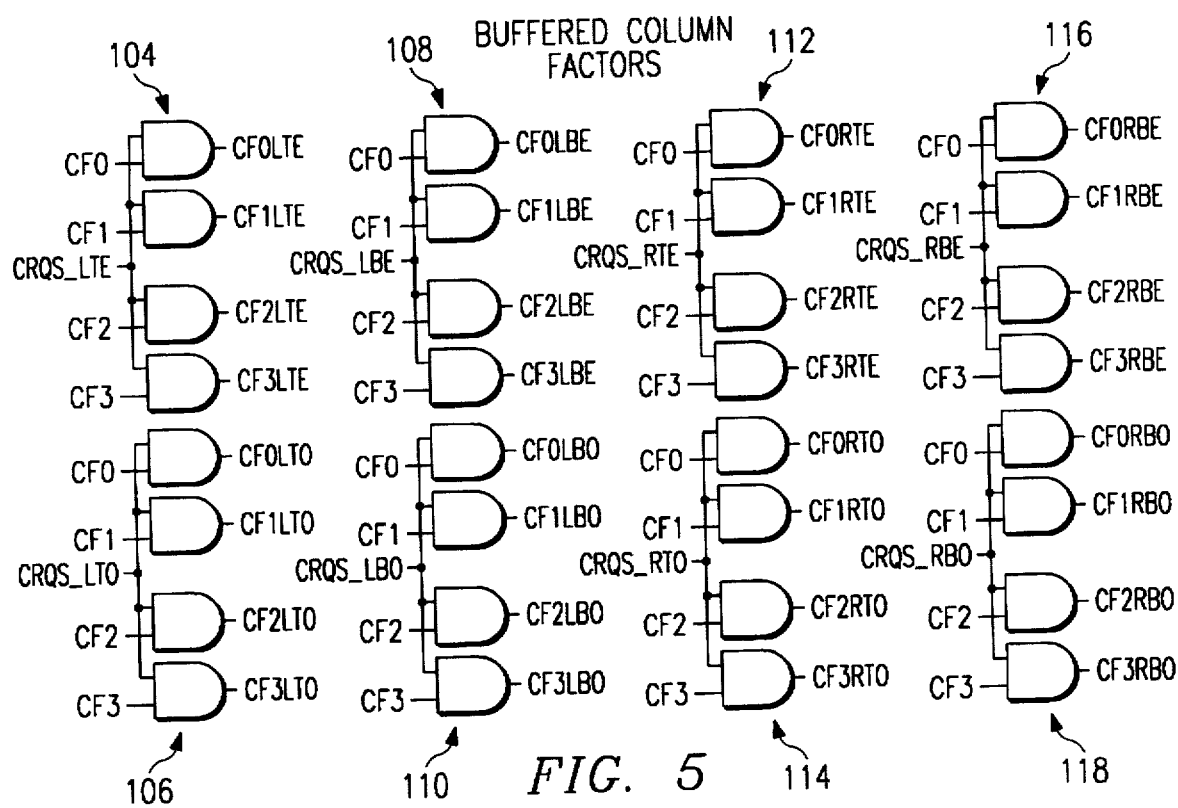
FIG. 5 provides a logic circuit for generating two buffered column factor inputs to the main memory matrix of the present invention, and a means to disable the column factors using the column redundant quadrant select (CRQS)

FIG. 5 illustrates the logical network that buffered column factor circuit 72 includes. Specifically, buffered column factor circuit 72 includes AND gate set 104 for responding to the signal CRQS_LTE for the left top Y-select and even local I/O group within main and redundant memory matrix 38, AND gate set 106 for responding to the signal CRQS_LTO, AND gate set 108 for responding to the signal CRQS_LBE, AND gate set 110 by responding to the signal CRQS_LBO, AND gate set 112 for responding to the signal CRQS_RTE, AND gate set 114 for responding to the signal CRQS_RTO, AND gate set 116 for responding to the signal CRQS_RBE, and AND gate set 118 for responding to the signal CRQS_RBO.

FIG. 6 shows a block diagram of the main and redundant memory matrix 38 of the present embodiment. In main and redundant memory matrix 38 appear sixteen sets of memory arrays with sets 120, each with two 128k memory arrays 122 and 124 associate with one sense amplifiers bank 126. Only two memory array sets 120 are shown. The dots between the two shown memory arrays depict the remaining fourteen memory array sets 120. Each 128k memory array includes redundant columns 128 and 130 as well as redundant rows 132. Y redundancy lines 79 provides four inputs for each quadrant, which is composed of four memory arrays 120, to redundant columns, for example 128 and 130. Row factor inputs, as characterized by reference numerals 28', 30', 32' and 34', come from buffered row factors circuit 36 to provide row factor inputs to rows of memory arrays 120. Write clock line 49 provides clock signals to sense amplifiers 126. Local I/O control lines 66 also provide inputs to sense amplifiers 126. Column factors lines 76 and 78 provide inputs to the columns of memory arrays 122 and 124. For each of the sixteen memory array sets 120, DQ lines DQ0 through DQ15 communicate with input and output data, one DQ line per memory array set. X redundancy lines 42 provide inputs to X redundancy rows 132. Sense amplifiers 126 include redundant sense amplifiers 134 and 136.

Figure 7:
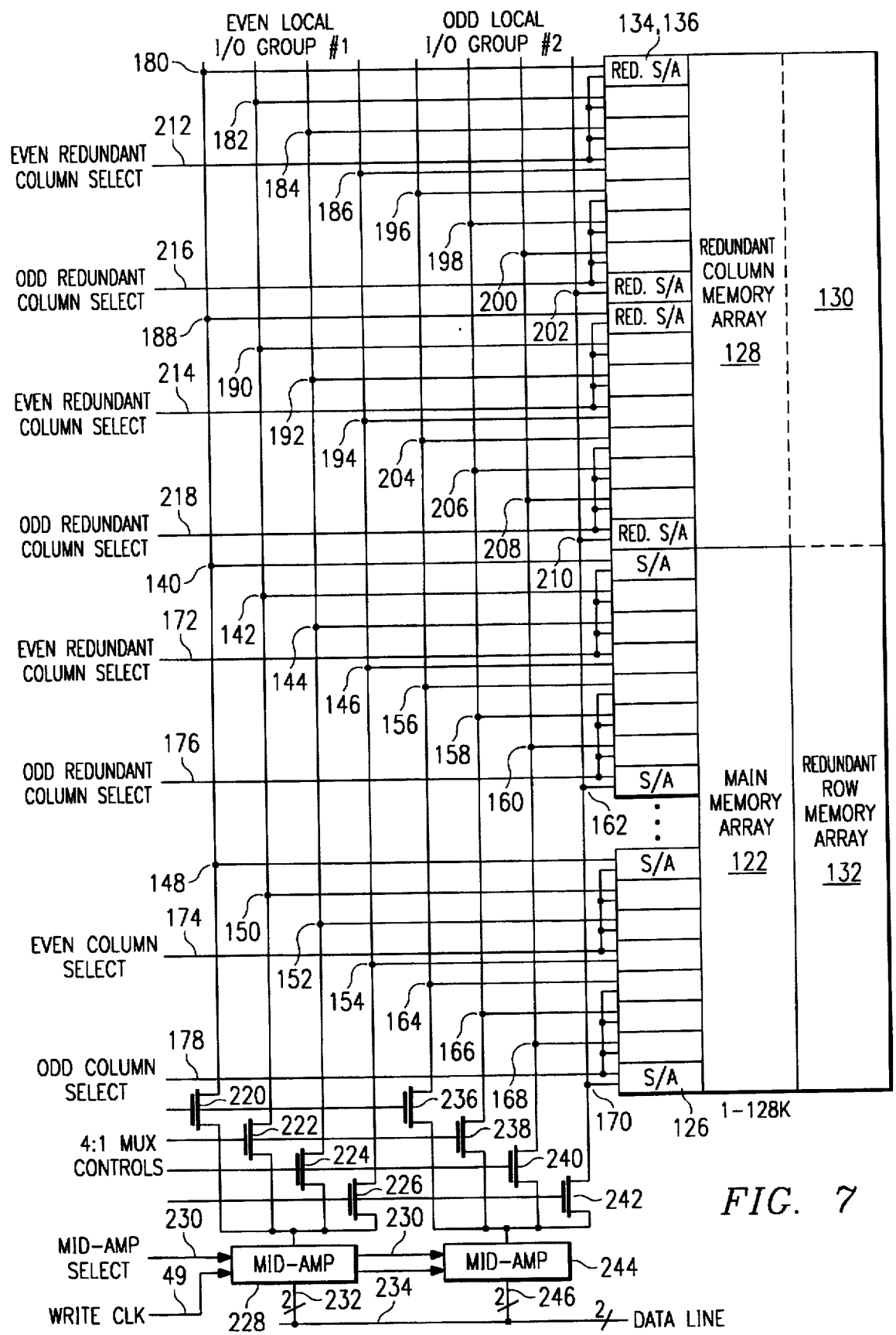
FIG. 7 shows in more detail the sense amplifier and memory array with redundant array configuration of the present invention.

FIG. 7 shows in more detail the even and odd local I/O lines grouping of the present invention. For each combination of sense amplifiers set 120, main memory array 122 associates with redundant column memory arrays 128 and 130 as well as redundant row memory array 132. Sense amplifiers 126 couple with main memory array 122, while redundant sense amplifiers 134 and 136 coupled to redundant column memory arrays 128, 130, and redundant row memory array 132. Input/Output connections for the memory array set divides between an even local I/O group #1 and odd local I/O group #2. Sense amplifiers 126 connect to even local I/O group #1 at nodes 140, 142, 144 and 146, as well as nodes 148, 150, 152 and 154. Sense amplifiers 126 connect with odd local I/O group #2 at nodes 156, 158, 160 and 162, as well as nodes 164, 166, 168 and 170. Even column select signal line 172 controls the connection of sense amplifiers 126 to nodes 140, 142, 144 and 146. Even column select line 174 controls the connection of sense amplifiers 126 to nodes 148, 150, 152 and 154 of even local I/O group #1. Odd redundant column select line 176 controls the connection of sense amplifiers 126 to nodes 156, 158, 160 and 162 to odd local I/O group #2. Odd column select line 178 controls the connection of sense amplifiers 126 to nodes 164, 166, 168 and 170. Redundant sense amplifiers 134 and 136 connect to even local I/O group #1 at nodes 180, 182, 184, and 186. Redundant sense amplifiers 134 and 136 also connect to even local I/O group #1 at nodes 188, 190, 192, and 194. Redundant sense amplifiers 134 and 136 connect to odd local I/O group #2 at nodes 196, 198, 200, and 202. Redundant sense amplifiers 134 and 136 connect to odd local I/O group #2 also at nodes 204, 206, 208, and 210. Even redundant column select line 212 controls the connection of redundant sense amplifiers 134 and 136 to even local I/O group #1 for delivering signals to nodes 180, 182, 184 and 186. Even redundant column select line 214 controls with connection of redundant sense amplifiers 134 and 136 to nodes 188, 190, 192 and 194. Odd redundant column select line 216 controls the connection of redundant sense amplifiers 134 and 136 to nodes 196, 198, 200 and 202 of odd local I/O group #2, while odd redundant column select 218 controls the connection of redundant sense amplifiers 134 and 136 to nodes 204, 206, 208 and 210 of odd local I/O group #2.

Transistors 220, 222, 224, and 226 control the passage of signals from even local I/O group #1 to mid-amp 228. A mid-amp select signal on a lead 230 controls mid-amp 228 provide or receive on line 232 output or input, respectively, to data line 234. Transistors 236, 238, 240 and 242 control the passage of signals from local I/O group #2 to mid-amp 244. The mid-amp select signal on the lead 230 and write clock 49 also control the operation of mid-amp 244 to provide or receive on line 246 output or input data, respectively, to data line 234.

Figure 9:
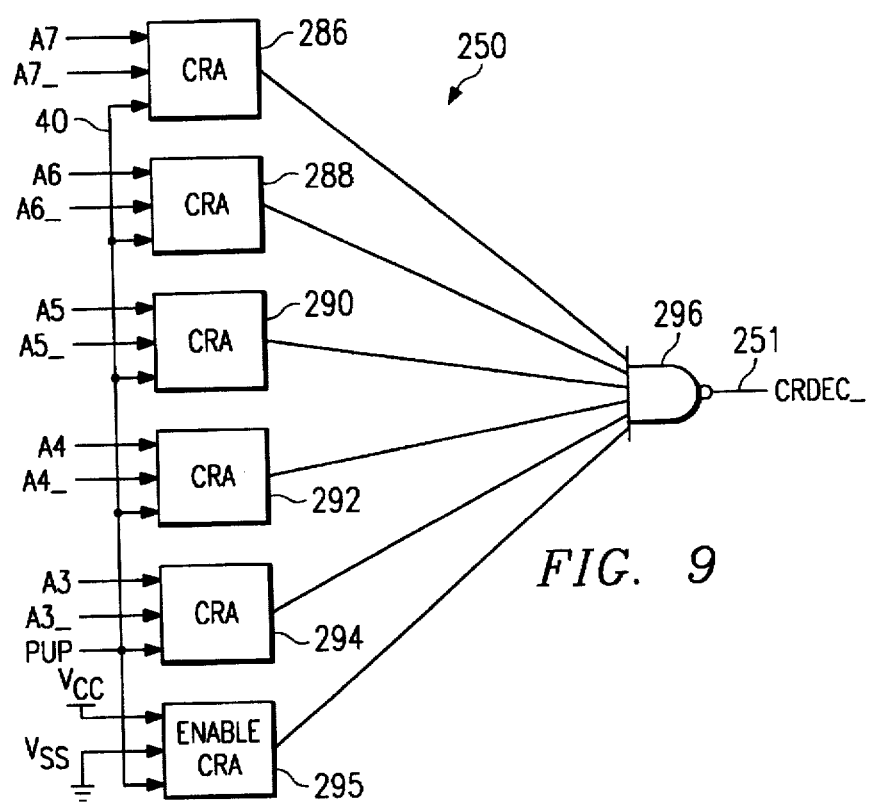
FIG. 9 shows a logic circuit diagram for the A3 through A7 inputs for generating the column redundant decode (CRDEC) circuit of FIG. 8.

FIG. 8 depicts yet further detail the column redundant Y-select circuits of the present invention. In FIG. 8, column redundant decoders circuit 68 receives inputs CRA3 through CRA7 and an enable signal as indicated by blocks 250, 252, 254, 256, 258 and 260. CRDEC 0 received CRA3 through CRA7 and an enable signal through input 251, as shown in FIG. 9, to generate CRDEC_0 output to CRQS circuit 274 and column redundant Y-select (CRY) circuit 280. CRDEC 1 circuit receives CRA3 through CRA7 and an enable signal through input 253 to generate CRDEC_1 input to CRQS circuit 276 and CRY circuit 280. CRDEC2 circuit receives CRA3 through CRA7 and an enable signal through input 255 to produce CRDEC_2 input to CRQS circuit 278 and CRY circuit 280. CRDEC 3 circuit receives CRA3 through CRA7 and an enable signal through input 257 to generate CRDEC_3 input to CRQS circuit 282 and CRY circuit 280. CRDEC 4 circuit receives CRA3 through CRA7 and an enable signal through input 259 to generate CRDEC_4 input to CRQS circuit 284 and CRY circuit 280. Finally, CRDEC 5 circuit receives CRA3 through CRA7 and an enable signal through input 261 to generate CRDEC_5 input to CRQS circuit 286 and CRY circuit 280.

CRQS circuit 274, CRQS circuit 276 and CRQS circuit 278, each generate the signals CRQS_RTE, CRQS_RBE, CRQS_RBE, and CRQS_RBE on CRQS output lines 70. CRQS circuit 282, CRQS circuit 284, and CRQS circuit 286 each generate outputs CRQS_LTO, CRQS_LBO, CRQS_RTO, and CRQS_RBO on CRQS output lines 70. The four lines, CRQS_LTE, CRQS_LBE, CRQS_RTE, and CRQS_RBE are controlled by the CRQS circuits 274, 276 and 278, depending on an address match back in CRDEC 0, CRDEC 1, or CRDEC 2. Accordingly, there are three levels, that is, three different Y selects that can be repaired. This provides four Y select outputs per quadrant, two even and two odd, one even and one odd in the top, one even and one odd in the bottom.

As FIG. 8 indicates, the CRQS_LTE signal goes to column redundant Y select (CRYSEL) signal output CRYSEL LT 0E and CRYSEL LT 2E. CRQS_LBE input goes to CRYSEL LB 0E and CRYSEL LB 2E circuit. The CRQS_RTE input goes to CRYSEL RT 0E and CRYSEL RT 2E circuit. The CRQS_RBE signal goes to CRYSEL RB 0E and CRYSEL RB 2E circuit. The CRYQS_LTO signal goes to CRYSEL LT 10 and CRYSEL LT 30 circuit. The CRQS_LBO signal goes to CRYSEL LB 10 and CRYSEL LB 30 circuit. The CRQS_RTO signal goes to CRYSEL RT 10 and CRYSEL RT 30 circuit. The CRQS_RBO signal goes to CRYSEL RB 10 circuit and CRYSEL RB 30 circuit. CRY circuit 280 determines the high or low outputs CRYL and CRYH, respectively. CRYL goes to the top of the 128 k memory arrays. CRYH goes to the bottom of the 128 k memory arrays. Even and odd designators, specifically apply to even redundancy and odd redundancy selects. CRY circuit 280, therefore, generates CRYL signal on line 283 that goes to CRYSEL LT 0E, CRYSEL LT 10, CRYSEL LB 0E, CRYSEL LB 10, CRYSEL RT 0E, CRYSEL RT 10, CRYSEL RB 0E and CRYSEL RB 10. Line 284 carries a CRYH signal from CRY circuit 280 to CRYSEL LT 2E, CRYSEL LT 30, CRYSEL LB 2E, CRYSEL LB 30, CRYSEL RT 2E, CRYSEL RT 30, CRYSEL RB 2E and CRYSEL RB 30. The circuitry of FIG. 8 provides a way for the column redundant Y-selects to replace the normal Y-selects associated with like local I/O line pairs.

FIG. 9 shows in more detail the A3 through A7 and the DC enable inputs, such as inputs 250 column redundant decode circuit 68 appearing in FIG. 8. As FIG. 9 illustrates, each address, A3 through A7, and its complement, $\overline{A3}$ through $\overline{A7}$, and a fuse circuit to enable the decoder, together with power up pulse (PUP) on the lead 40 goes to a different one of the column redundant address circuits 286 through 295. If a match occurs in column redundant address circuits 286 through 295, output goes to NAND gate 296. NAND gate 296, upon receiving all inputs from CRA circuits 286 through 295 provides CRDEC_ 251 output, such as CRDEC_0 output of FIG. 8.

FIG. 10 shows one embodiment of CRY circuit 280 of FIG. 8 for determining even and odd, and high and low outputs, as indicated by FIG. 8. As FIG. 10 depicts, the signals CRDEC_0 through CRDEC_2 go to NAND gate 300. Signals CRDEC_3 through CRDEC_5 go to NAND gate 302. NAND gate 300 generates upon receiving a low signal from CRDEC_0, CRDEC_1, or CRDEC_2 signals, CRDE output and input 304 to OR gate 306. NAND gate 302, upon receiving a low signal from CRDEC_3, CRDEC_4, or CRDEC_5 signals, generates CRDO output and input 308 to OR gate 306. OR gate 306 output goes to AND gate 310 and AND gate 312. AND gate 310 generates CRYL output in response to a match in the CA7_ and OR gate 306 output signal. AND gate 312 generates CRYH output in response to the match in the CA7 and OR gate 306 output signal.

CRY circuit 280, therefore, determines which decoder the present embodiment enables. Note that while it is possible to enable both even and odd decoders at the same time, it is not possible to enable both high and low decoders at the same time.

FIG. 11 illustrates one embodiment of the column redundant quadrant select (CRQS) circuit 274 of the present invention, as shown in FIG. 8. CRQS circuit 274 determines in which quadrant this redundant Y-select is firing, and provides the ability to direct the redundancy selection.

As FIG. 11 indicates, either a CRDO or CRDE signal on line 314 flows from CRY circuit 280 (of FIG. 10) to CRQSTRI circuit 316 generating a left top (LT) signal, CRQSTRI circuit 318 as part of the input for generating a left bottom (LB) signal, CRQSTRI circuit 320 generating a right top (RT) signal, and CRQSTRI circuit 322 generating a right bottom (RB) signal. In addition, an appropriate CRDEC_ signal on line 324, such as CRDEC_0 for CRQS circuit 274, goes to the CRQSTRI circuits 316, 318, 320, and 322 for the respective LT, LB, RT, and RB outputs. Power up pulse 40 goes to CRA circuit 326 and 328, which also receives voltages $V_{CC}$ and $V_{SS}$. Output from CRA circuit 326 goes to AND gate 330 and 332. Inverter 334 inverts the CRA circuit 326 output and sends it to AND gate 334 and 336. CRA circuit 328 provides input to AND gate 336 and AND gate 332. Inverter 338 inverts the output from CRA circuit 328 and provides it to AND gate 334 and 330. The ANDed output from AND gate 334 goes to CRQSTRI circuit 316. The output from AND gate 330 goes to CRQSTRI circuit 318. The output from AND gate 336 goes to CRQSTRI circuit 320, and the output from AND gate 332 goes to CRQSTRI circuit 322. Depending on the combination of fuses which are blown in the two CRA circuits, the CRA circuits select only one of the four logical AND gates to have a high output. In so doing, only one quadrant is selected in which the redundant Y-select can activate, when an address match occurs, for each decoder.

FIG. 12 shows column redundant address (CRA) circuit 286 that corresponds to CRA circuit 286, as well as CRA circuits 288 through 295, of FIG. 9. CRA circuit 286 also provides circuitry that corresponds to row redundant decoders circuit 26 of FIG. 1. Accordingly, although the following discussion pertains to CRA circuit 286, much of the applicability directly relates to the structure and function of row redundant decoders circuit 26.

As FIG. 12 depicts, an address input Ax, where x ranges from 3 to 7, travels along line 340, for example, to transistor pair 342. Transistor pair 342 includes transistor 344 and transistor 346. The complement of address $\overline{Ax}$, where x ranges from 3 to 7, travels on line 348 to transistor pair 350 which includes P-channel transistor 352 and N-channel transistor 354. Node 356 between N-channel transistor 346 and P-channel transistor 352 connects to the output of inverter 358. Input node 362 of inverter 358 connects to the gates of transistor 344 and transistor 354. Also, the source connections for transistor 360 and transistor 364 connect to the input of inverter 358. Transistors 360 and inverter 358 form latch 365. Fuse 366 connects between the drain of transistor 368 and the source of transistor 364. Power up pulse 40 goes to the gates of N-channel transistor 364 and P-channel transistor 368. FIG. 12 also includes timing diagrams 370 and 372 that respectively, show the characteristics of the external voltage $V_{CC}$ and power up pulse (PUP) 40.

As mentioned previously, column redundant decoders circuit 68 includes six circuits such as CRA circuit 286 per decoder set, and row redundant decoders circuit 26 includes, nine such circuits per decoder set. These decoder circuits are controlled by a fuse circuit, and one fuse circuit used as an enable for the decoder function. The fuse circuit portion of CRA circuit 286 is comprised of latch 365, pull-up transistor 368 and pull-down transistor 364, as well as fuse 366. All fuse circuits receive a high going pulse on power up of the device from PUP input 40. If fuse 366 is intact, latch node 362 is pulled high initially when PUP is low. When PUP input 40 goes high, latch node 362 is pulled low by transistor 364. Finally, when PUP input goes back low, latch node 362 is pulled high by transistor 368, where it remains until power is removed from the device. While latch node 362 is high, the Ax_ signal is allowed to pass to the output, OUT.

Conversely, if the fuse is blown, the drain connection of device 368 through the fuse cannot be made to node 362. Initially, when PUP is low, the latch node 362 is indeterminate. When PUP input 40 goes high, latch node 362 is pulled low by transistor 364. This fixes the latch 365 in this state since the inverter output and the gate of transistor 360 is high which causes transistor 360 also to pull latch node 362 low. When PUP finally returns low, again pull-up transistor 368 has no effect on the latch since the fuse is blown.

Since PUP input 40 does not fire again until the device is removed from its power source and then resupplied with power, latch 365 is fixed in either a high or low state. As such, latch 365 determines whether the true address or the inverted address is allowed to go to a logical NAND gate. Another input into the NAND is the output from the enable fuse circuit. The enable fuse circuit is identical to the multiplexer fuse circuits except that the inputs to the multiplexer are the power supplies $V_{cc}$ and $V_{ss}$. If the fuse of the enable circuit is blown, signal $V_{cc}$ is allowed to pass to the output, OUT, and on to the logical NAND gate.

If all of the inputs to the NAND are high during an active cycle, an external address to redundant address match has occurred and the decoder has been enabled. The decoder fires the CRDEC_ which in turn activates the appropriate CRQS block and the CRY block. The CRQS block allows one of the CRQS_ lines to go low. The other three remain high. The low signal disables the buffered column factors block 72, and along with CRYL or CRYH, fires a redundant Y-select.

FIG. 13 shows one embodiment of CRQSTRI circuit 316, as well as CRQSTRI circuits 318, 320, and 322, of FIG. 11. In CRQSTRI circuit 316, CRDEC_x, where x ranges from 0 to 5, goes to inverter 374, the gate of P-channel transistor 376 and P-channel transistor 378, as well as the gate of N-channel transistor 380. The output of inverter 374 goes to the gates of N-channel transistors 382, and 384, as well as P-channel transistor 386. $N_Y$ input, where Y equals A, B, C, or D, as indicated in FIG. 11, provides an input to transistor pairs 382 and 376, and 384 and 378. If the CRDEC_x input is low, both of the transistor pairs allow the $N_Y$ input to pass nodes 388 and 392. At the same time, CRDEC_x turns off transistor 380 from effecting node 392, and through inverter 374, turns off transistor 386 from effecting node 388. The state of $N_Y$ determines the voltage on nodes 388 and 392. If these nodes, which have a like voltage, are low, transistor 390 turns on and node 396 goes high. Conversely, if $N_Y$ is high, transistor 394 turns on and node 396 goes low. Signal $N_Y$ is only allowed to control the output 396 if CRDEC_x is low.

If CRDEC_x is high, both of the transistor pairs do not allow $N_Y$ to pass to nodes 388 and 392. Also, transistor 380 is turned on and pulls node 392 low. Likewise, CRDEC_x through inverter 374, turns on transistor 386. Transistor 386 pulls node 388 high. Since node 392 is low and node 388 is high, transistors 390 and 394 are both off. As a result, node 396 is at a tristate level. Through this architecture, three CRQS blocks, for example 274, 276 and 278, share common lines. Only one of the decoder sets will be selected at a time so that only one of the three CRQS circuits will have CRDEC_x low. The other unselected CRQS blocks in the group will have CRDEC_x high which will cause the outputs of their four CRQSTRI blocks to be tristate which will not effect the one active block.

If no address match occurs with any of the three decoder sets, CRDE and/or CRDO will be low, as determined by the logic in CRY block 280 (see FIG. 10). Since CRDE and/or CRDO are low, transistor 398 will be on which will cause all of the CRQSTRI circuits to pull-up on node 396. The result is that all of the common CRQS_ lines will be high; the buffered column factors circuit 72 will not be disabled; and the redundant Y-select will not fire.

Figure 14:
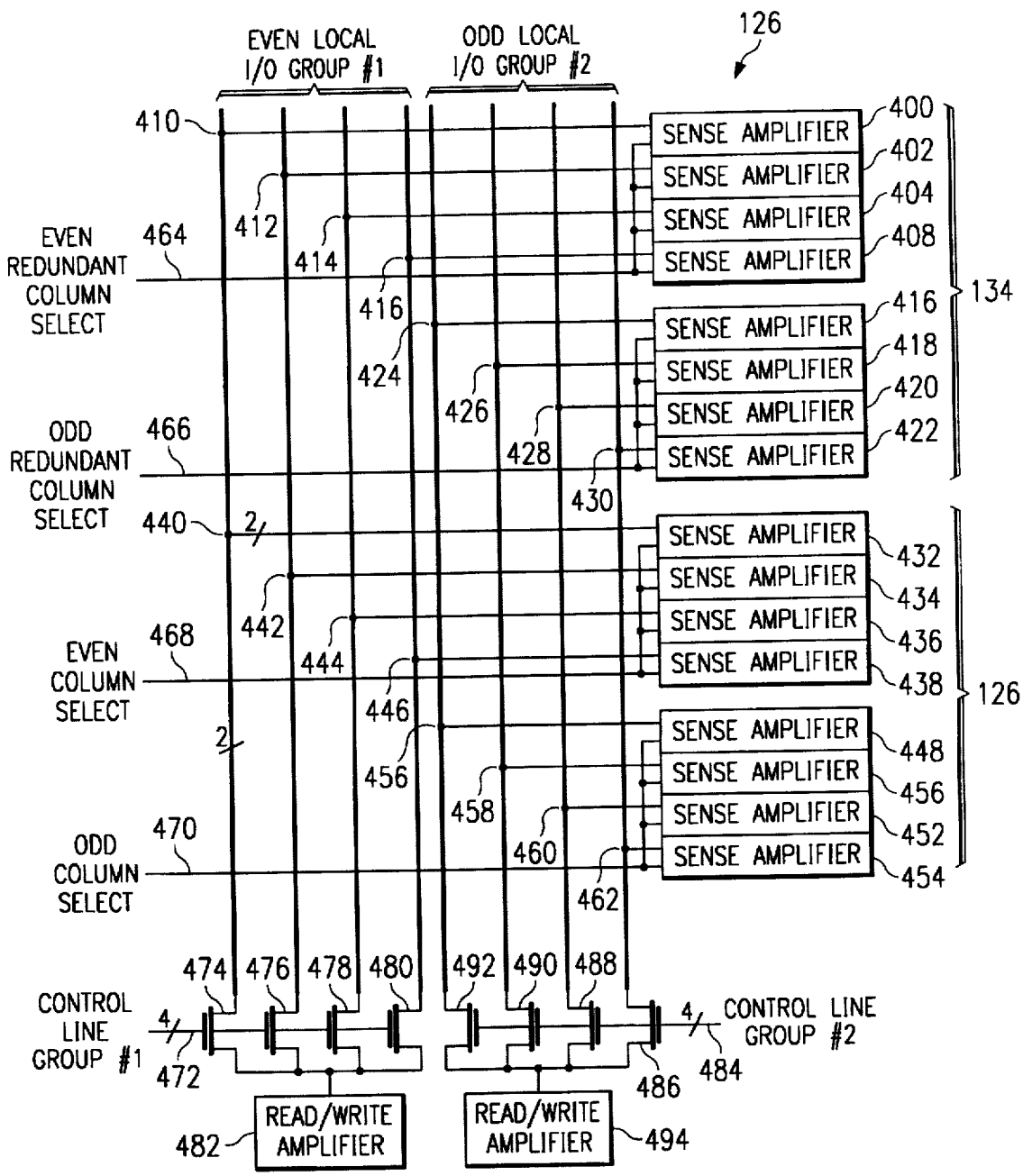
FIG. 14 illustrates a column select organization for two groups of local I/O lines.

FIG. 14 illustrates redundant sense amplifier bank 134 and sense amplifier bank 126 both of which connect to even local I/O group #1 and odd local I/O group #2. In redundant sense amplifier bank 134, redundant sense amplifiers 400, 402, 404, and 408 connect to even local I/O group #1 at nodes 410, 412, 414, and 416. Sense amplifiers 416, 418, 420, and 422 connect to odd local I/O group #2 at nodes 424, 426, 428, and 430. Sense amplifier bank 134 can have additional groups of eight sense amplifiers of like arrangement to allow multiple repairs to the same local I/O line groups. Sense amplifier bank 126 includes sense amplifiers 432, 434, 436, and 438 that connect to respective nodes 440, 442, 444, and 446 of even local I/O group #1. Sense amplifiers 448, 450, 452, and 454 connect to respective nodes 456, 458, 460, and 462 of odd local I/O group #2. Sense amplifier bank 126 has additional sense amplifiers of like arrangements which are not shown since one group of eight sense amplifiers are required for operation in a single access but that multiple groups of eight sense amplifiers are needed to access the entire memory. Even redundant column select line 464 controls the firing of sense amplifiers 400, 402, 404, and 408. Odd redundant column select line 466 controls the firing of sense amplifiers 416, 418, 420, and 422. Even column select line 468 controls the firing of sense amplifiers 432, 434, 436, and 438. Odd column select line 470 controls the firing of sense amplifiers 448, 450, 452, and 454. Control line group #1 provides 4 input lines 472 that respectively control transistors 474, 476, 478, and 480 to permit output to read/write amplifier 482. Control line group #2 via the 4 lines 484 controls transistors 486, 488, 490, and 492 to permit output to go to read/write amplifier 494.

Figure 15:
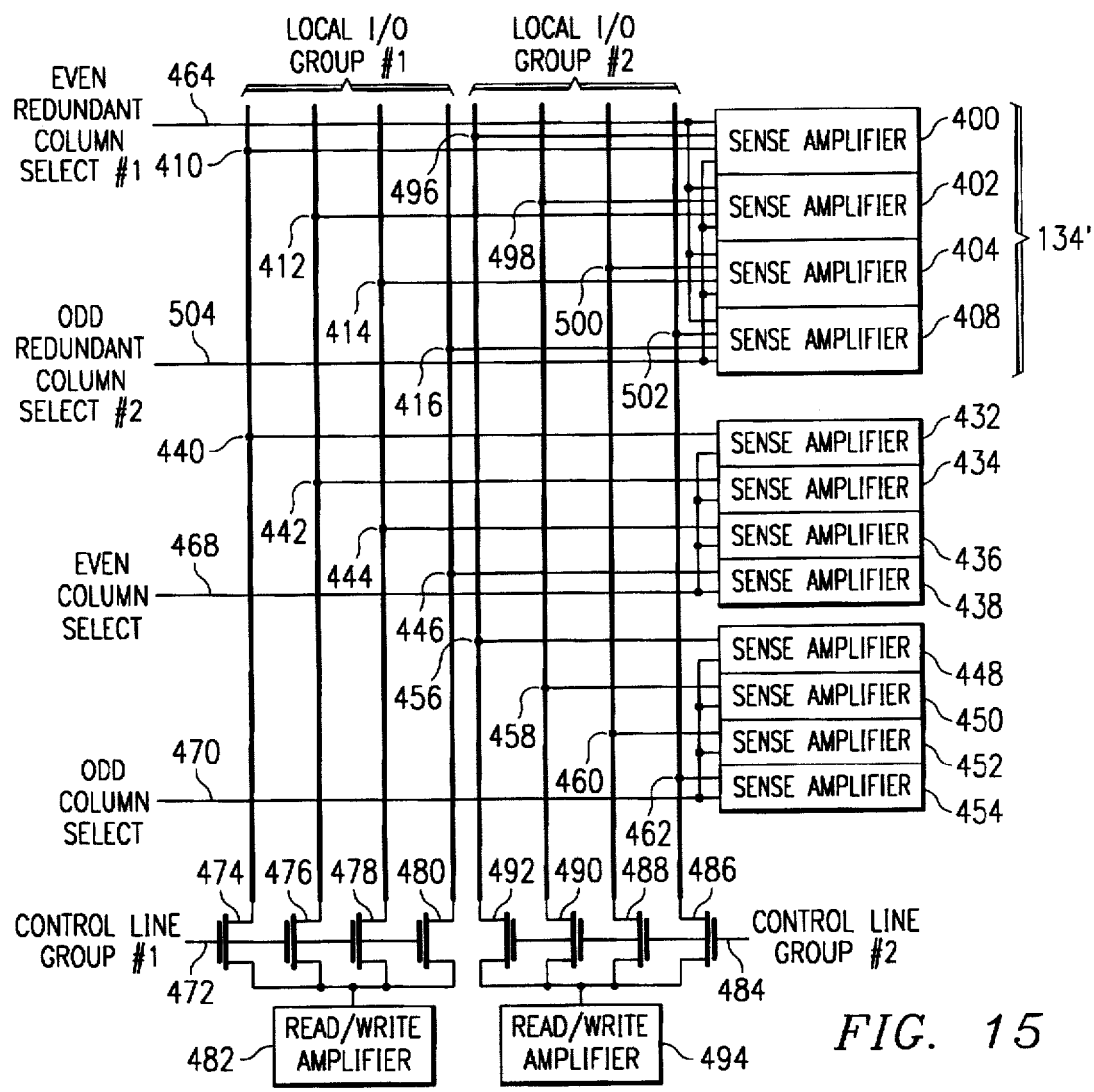
FIG. 15 shows column select organization for two groups of local I/O lines using a dual redundant column select attached through a passgate to the same sense amplifier.

FIG. 15 shows another embodiment of the present invention in which sense amplifiers 432 through 454 connect to nodes 440 through 462 as described in association with FIG. 14. Even column select line 468 and odd column select line 470 control the firing of sense amplifiers 432 through 454 as already described. in FIG. 15, redundant sense amplifiers 134' include a single sense amplifier bank of sense amplifiers 400, 402, 404, and 408. Sense amplifier 400, in contrast to previously described embodiments, connects both to node 410 of local I/O group #1 and to node 496 of local I/O group #2. Likewise, sense amplifier 402 connects to node 412 and to node 498. Sense amplifier 404 connects to node 414 and node 500. Sense amplifier 408 connects to node 416 as well as node 502. As previously described, even column select line 464 controls the firing of sense amplifiers 400 through 408 to nodes 410 through 416 of local I/O group #1. Odd redundant column select line 504 also controls sense amplifiers 400 through 408, but controls sense amplifiers 400 through 408 to fire to nodes 496 through 502 of local I/O group #2. Control line group #1 and control line group #2 operate as previously described in connection with FIG. 14.

But on FIG. 15, therefore, two redundant column selects both attach. The concept is that a redundant column select does not necessarily need to line up with the normal column select. The configuration of FIG. 15 permits picking which group of local I/O lines the sense amplifiers will attach to. If one set fuse is blown, though, that determines how the device will always operate. This configuration provides an advantage in savings of circuit space with the same or equivalent level of redundant repairability.

The solution depends on the concept of a dual redundant column select. During laser repair, the redundant sense amplifiers can be programmed to one of two local I/O lines, depending on the fail pattern. During a cycle in which redundant columns are used, only one of the two redundant column selects would fire. With this architecture, the redundant sense amplifiers provide greater coverage, therefore, increasing the yield for the same amount of redundancy or reducing the redundancy for the same yield compared against traditional methods.

With regard to the architecture of FIG. 14, all eight of the redundant sense amplifiers in FIG. 14 are connected to a single, distinct local I/O line pair. If a repair is made using one of the two groups of four redundant sense amplifiers, any future repair is severely limited or impossible. By splitting the redundant column select into two segments (FIG. 15), the even redundant column select is used to repair normal sense amplifiers connected to local I/O group #1, and odd redundant column select is used to repair normal sense amplifiers connected to local I/O group #2. Once the redundant column selects are programmed, only one of the redundant column selects even or odd will ever be used.

With the dual redundant column select architecture, two column selects fire in every cycle. The organization, however, allows two normal, one redundant and one normal, or two redundant column selects to fire. This concept requires four, instead of eight, sense amplifiers to make a repair for the given example. In this fashion, the dual redundant column select allows greater coverage for the same amount of redundancy, which in turn, should reduce the amount of redundancy required in wide local I/O bus architectures.

Figure 16:
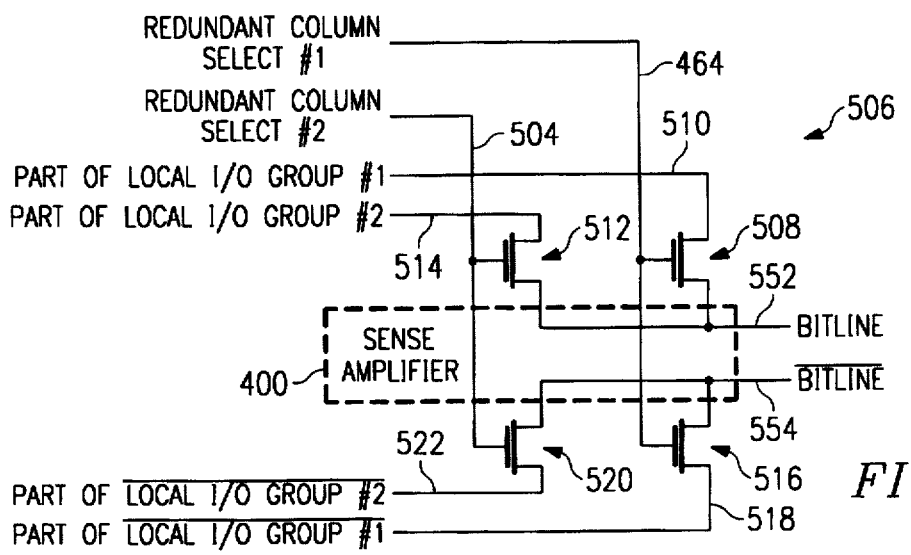
FIG. 16 provides a circuit diagram of a sense amplifier arranged for the dual redundant column select architecture of FIG. 15.

FIG. 16 illustrates circuit 506 that provides two redundant column selects attached to each sense amplifier to achieve the purposes of the embodiment of FIG. 15. In particular, redundant column select line 464 connects to the gate of N-channel transistor 508 that connects between local I/O line 510 and bitline 552. Redundant column select line 504 connects to the gate of transistor 512 which connects between local I/O line 514 and BITLINE 552 within sense amplifier 400. Likewise, redundant column select line 464 connects through sense amplifier 400 to the gate of transistor 516 that connects between BITLINE 554 and line 518 that carries the complement of the signal appearing on line 510. REDUNDANT COLUMN SELECT #2 line 504 connects to the gate at transistor 520 that connects between line 522 that carries the complement of the signal appearing on line 514 and BITLINE 552.

In FIG. 16, note that only one pass gate (a single N-channel transistor) is used to connect the BITLINE 552 to LOCAL I/O GROUP #1. The same is true for the BITLINE 554 and the $\overline{\text{LOCAL I/O GROUP \#1}}$. This is typical of both the normal and redundant sense amplifier. The only difference comes from the addition of a second pass gate in the redundant sense amplifier to connect the BITLINE to LOCAL I/O GROUP #2 and the $\overline{\text{BITLINE TO LOCAL I/O GROUP \#2}}$. The capacitance added to the bitline is equal to the source capacitance of the additional N-channel pass gate. The added capacitance is minimal.

In summary, by adding an additional column select to the redundant sense amplifier for split or "wide" local I/O lines, the extreme overhead required to maintain adequate redundancy is reduced. The advantages allow a smaller amount of silicon area to be used while the differences between normal and redundant sense amplifiers are insignificant.

Although the present invention has been described in detail, it should be understood that various changes, substitutions and alterations can be made thereto without departing from the spirit and scope of the invention as defined by the appended claims.

What is claimed is:

1. A memory device, comprising:
   an array of subarrays of memory cells, each subarray arranged in rows and columns of memory cells and at least one redundant column of memory cells;
   a row address circuit coupled to receive a row address signal for selecting a row of memory cells in a selected subarray;

a column address circuit coupled to receive a first select signal and a second select signal, the column address circuit arranged for selecting a first column of memory cells at a first time from the row of memory cells in response to the first logic state of the first select signal and for selecting a second column of memory cells at the first time from the row of memory cells in response to a first logic state of the second select signal; and a column redundancy circuit for producing a second logic state of the second select signal in response to a predetermined column address, the column redundancy circuit selecting the at least one redundant column of memory cells from the row of memory cells in response to a second logic state of the second select signal, the first column of memory cells producing the first datum at the first time and the redundant column of memory cells producing a redundant datum at the first time.

2. A memory device as in claim 1, wherein the column redundancy circuit further includes:

a plurality of programmable memory elements for storing the predetermined column address, each programmable memory element coupled to receive a respective address bit for selectively producing a true or complement of the address bit; and a redundant column decode circuit coupled to receive the true or complement of the address bit from each of the plurality of programmable memory elements for producing the second select signal.

3. A memory device as in claim 1, further comprising:

a first and a second amplifier circuit, each amplifier having an input terminal and an output terminal, each amplifier receiving a datum at the respective input terminal and producing an amplified datum at the respective output terminal at a second time;

a first select transistor having a control terminal and a current path, the current path coupled between the first column of memory cells and the first amplifier circuit, the control terminal coupled to receive the first select signal for applying the first datum to the input terminal of the first amplifier;

a second select transistor having a control terminal and a current path, the current path coupled between the second column of memory cells and the second amplifier circuit, the control terminal coupled to receive the second select signal for applying the second datum to the input terminal of the second amplifier in response to the first logic state of the second select signal; and a third select transistor having a control terminal and a current path, the current path coupled between the at least one redundant column of memory cells and the second amplifier circuit, the control terminal coupled to receive the second select signal for applying the redundant datum to the input terminal of the second amplifier in response to the second logic state of the second select signal.

4. A memory device as in claim 3, further comprising:

a first input/output line coupled between the first select transistor and the first amplifier circuit; and a second input/output line coupled between the second select transistor and the second amplifier circuit and coupled to the third select transistor.

5. A memory device as in claim 4, further comprising:

a first group of columns of memory cells including the first column of memory cells;

a first group of input/output lines inducting the first input/output line coupled to receive data at the first time from respective columns of memory cells in the first group of columns of memory cells;

a first group of multiplex transistors for selectively applying a datum from the first group of columns of memory cells to the first amplifier in response to an address signal;

a second group of columns of memory cells including the second column of memory cells;

a second group of input/output lines including the first input/output line coupled to receive data at the first time from respective columns of memory cells in the second group of columns of memory cells; and a second group of multiplex transistors for selectively applying a datum from the second group of columns of memory cells to the second amplifier in response to the address signal.

6. A memory device as in claim 5, wherein the at least one redundant column of memory cells further comprises:

a first group of redundant columns of memory cells for applying data to the first group of input/output lines in response to the first select signal; and a second group of redundant columns of memory cells for applying data to the second group of input/output lines in response to the second select signal.

7. A memory device as in claim 1, further comprising:

a first and a second amplifier circuit, each amplifier having an input terminal and an output terminal, each amplifier receiving a datum at the respective input terminal and producing an amplified datum at the respective output terminal;

a first select transistor having a control terminal and a current path, the current path coupled between the first column of memory cells and the first amplifier circuit, the control terminal coupled to receive the first logic state of the first select signal for applying the first datum to the input terminal of the first amplifier;

a second select transistor having a control terminal and a current path, the current path coupled between the second column of memory cells and the second amplifier circuit, the control terminal coupled to receive the first logic state of the second select signal for applying the second datum to the input terminal of the second amplifier;

a third select transistor having a control terminal and a current path, the current path coupled between the at least one redundant column of memory cells and the first amplifier circuit, the control terminal coupled to receive the second logic state of the first select signal for applying the redundant datum to the input terminal of the first amplifier; and a fourth select transistor having a control terminal and a current path, the current path coupled between the at least one redundant column of memory cells and the second amplifier circuit, the control terminal coupled to receive the second logic state of the second select signal for applying the redundant datum to the input terminal of the second amplifier.

8. A memory device as in claim 1, further comprising:

a plurality of banks of sense amplifiers, each bank of sense amplifiers interposed between the selected subarray of memory cells and another subarray of memory cells;

a first sense amplifier in a bank of sense amplifiers coupled to the first column of memory cells, the first column of memory cells in the selected subarray of memory cells;

a second sense amplifier in the bank of sense amplifiers coupled to the second column of memory cells, the second column of memory cells in the selected subarray of memory cells; and a redundant sense amplifier in the bank of sense amplifiers coupled to the at least one redundant column of memory cells, the at least one redundant column of memory cells in the selected subarray of memory cells.

9. A memory device as in claim 8, further comprising:

a third column of memory cells in the another subarray of memory cells, the third column of memory cells coupled to the first sense amplifier in the bank of sense amplifiers;

a fourth column of memory cells in the another subarray of memory cells, the fourth column of memory cells coupled to the second sense amplifier in the bank of sense amplifiers; and another at least one redundant column of memory cells in the another subarray of memory cells, the another at least one redundant column of memory cells coupled to the redundant sense amplifier in the bank of sense amplifiers.

10. A memory device as in claim 9, further comprising:

a first group of columns of memory cells including the first column of memory cells;

a first group of input/output lines including the first input/output line coupled to receive data at the first time from respective columns of memory cells in the first group of columns of memory cells;

a first group of multiplex transistors for selectively applying a datum from the first group of columns of memory cells to the first amplifier in response to an address signal;

a second group of columns of memory cells including the second column of memory cells;

a second group of input/output lines including the first input/output line coupled to receive data at the first time from respective columns of memory cells in the second group of columns of memory cells; and a second group of multiplex transistors for selectively applying a datum from the second group of columns of memory cells to the second amplifier in response to the address signal.

11. A memory device as in claim 10, wherein the at least one redundant column of memory cells of the selected subarray further comprises:

a first group of redundant columns of memory cells for applying data to the first group of input/output lines in response to the first select signal; and a second group of redundant columns of memory cells for applying data to the second group of input/output lines in response to the second select signal.

12. A dynamic random access memory device, comprising:

an array of subarrays of memory cells, each subarray arranged in rows and columns of memory cells and at least one redundant column of memory cells, each memory cell including an access transistor and a storage capacitor;

a row address circuit coupled to receive a row address signal for selecting a row of memory cells in a selected subarray;

a column address circuit coupled to receive a first select signal and a second select signal, the column address circuit arranged for selecting a first column of memory cells at a first time from the row of memory cells in response to the first logic state of the first select signal and for selecting a second column of memory cells at the first time from the row of memory cells in response to a first logic state of the second select signal; and a column redundancy circuit for producing a second logic state of the second select signal in response to a predetermined column address, the column redundancy circuit selecting the at least one redundant column of memory cells from the row of memory cells in response to a second logic state of the second select signal, the first column of memory cells producing the first datum at the first time and the redundant column of memory cells producing a redundant datum at the first time.

13. A memory device as in claim 12, wherein the column redundancy circuit further includes:

a plurality of programmable memory elements for storing the predetermined column address, each programmable memory element coupled to receive a respective address bit for selectively producing a true or complement of the address bit; and a redundant column decode circuit coupled to receive the true or complement of the address bit from each of the plurality of programmable memory elements for producing the second select signal.

14. A dynamic random access memory device as in claim 12, further comprising:

a first and a second amplifier circuit, each amplifier having an input terminal and an output terminal, each amplifier receiving a datum at the respective input terminal and producing an amplified datum at the respective output terminal at a second time;

a first select transistor having a control terminal and a current path, the current path coupled between the first column of memory cells and the first amplifier circuit, the control terminal coupled to receive the first select signal for applying the first datum to the input terminal of the first amplifier;

a second select transistor having a control terminal and a current path, the current path coupled between the second column of memory cells and the second amplifier circuit, the control terminal coupled to receive the second select signal for applying the second datum to the input terminal of the second amplifier in response to the first logic state of the second column address signal; and a third select transistor having a control terminal and a current path, the current path coupled between the at least one redundant column of memory cells and the second amplifier circuit, the control terminal coupled to receive the second select signal for applying the redundant datum to the input terminal of the second amplifier in response to the second logic state of the second select signal.

15. A dynamic random access memory device as in claim 14, further comprising:

a first input/output line coupled between the first select transistor and the first amplifier circuit; and a second input/output line coupled between the second select transistor and the second amplifier circuit and coupled to the third select transistor.

16. A dynamic random access memory device as in claim 15, further comprising:

a first group of columns of memory cells including the first column of memory cells;

a first group of input/output lines including the first input/output line coupled to receive data at the first time from respective columns of memory cells in the first group of columns of memory cells;

a first group of multiplex transistors for selectively applying a datum from the first group of columns of memory cells to the first amplifier in response to an address signal;

a second group of columns of memory cells including the second column of memory cells;

a second group of input/output lines including the first input/output line coupled to receive data at the first time from respective columns of memory cells in the second group of columns of memory cells; and a second group of multiplex transistors for selectively applying a datum from the second group of columns of memory cells to the second amplifier in response to the address signal.

17. A dynamic random access memory device as in claim 16, wherein the at least one redundant column of memory cells further comprises:

a first group of redundant columns of memory cells for applying data to the first group of input/output lines in response to the first select signal; and a second group of redundant columns of memory cells for applying data to the second group of input/output lines in response to the second select signal.

18. A dynamic random access memory device as in claim 12, further comprising:

a first and a second amplifier circuit, each amplifier having an input terminal and an output terminal, each amplifier receiving a datum at the respective input terminal and producing an amplified datum at the respective output terminal;

a first select transistor having a control terminal and a current path, the current path coupled between the first column of memory cells and the first amplifier circuit, the control terminal coupled to receive the first logic state of the first select signal for applying the first datum to the input terminal of the first amplifier;

a second select transistor having a control terminal and a current path, the current path coupled between the second column of memory cells and the second amplifier circuit, the control terminal coupled to receive the first logic state of the second select signal for applying the second datum to the input terminal of the second amplifier;

a third select transistor having a control terminal and a current path, the current path coupled between the at least one redundant column of memory cells and the first amplifier circuit, the control terminal coupled to receive the second logic state of the first select signal for applying the redundant datum to the input terminal of the first amplifier; and a fourth select transistor having a control terminal and a current path, the current path coupled between the at least one redundant column of memory cells and the second amplifier circuit, the control terminal coupled to receive the second logic state of the second select signal for applying the redundant datum to the input terminal of the second amplifier.

19. A dynamic random access memory device as in claim 12, further comprising:

a plurality of banks of sense amplifiers, each bank of sense amplifiers interposed between the selected subarray of memory cells and another subarray of memory cells;

a first sense amplifier in a bank of sense amplifiers coupled to the first column of memory cells, the first column of memory cells in the selected subarray of memory cells;

a second sense amplifier in the bank of sense amplifiers coupled to the second column of memory cells, the second column of memory cells in the selected subarray of memory cells; and a redundant sense amplifier in the bank of sense amplifiers coupled to the at least one redundant column of memory cells, the at least one redundant column of memory cells in the selected subarray of memory cells.

20. A dynamic random access memory device as in claim 19, further comprising:

a third column of memory cells in the another subarray of memory cells, the third column of memory cells coupled to the first sense amplifier in the bank of sense amplifiers;

a fourth column of memory cells in the another subarray of memory cells, the fourth column of memory cells coupled to the second sense amplifier in the bank of sense amplifiers; and another at least one redundant column of memory cells in the another subarray of memory cells, the another at least one redundant column of memory cells coupled to the redundant sense amplifier in the bank of sense amplifiers.

21. A dynamic random access memory device as in claim 20, further comprising:

a first group of columns of memory cells including the first column of memory cells;

a first group of input/output lines including the first input/output line coupled to receive data at the first time from respective columns of memory cells in the first group of columns of memory cells;

a first group of multiplex transistors for selectively applying a datum from the first group of columns of memory cells to the first amplifier in response to an address signal;

a second group of columns of memory cells including the second column of memory cells;

a second group of input/output lines including the first input/output line coupled to receive data at the first time from respective columns of memory cells in the second group of columns of memory cells; and a second group of multiplex transistors for selectively applying a datum from the second group of columns of memory cells to the second amplifier in response to the address signal.

22. A dynamic random access memory device as in claim 21, wherein the at least one redundant column of memory cells of the selected subarray further comprises:

a first group of redundant columns of memory cells for applying data to the first group of input/output lines in response to the first select signal; and a second group of redundant columns of memory cells for applying data to the second group of input/output lines in response to the second select signal.

23. A dynamic random access memory device as in claim 22, further comprising:

a first column select line overlying the selected subarray of memory cells and the another subarray of memory cells, the first column select line receiving a first column select signal for coupling the first group of columns of memory cells to the first group of input/output lines;

a second column select line overlying the selected subarray of memory cells and the another subarray of memory cells, the second column select line receiving a second column select signal for coupling the second group of columns of memory cells to the second group of input/output lines; and a redundant column select line overlying the selected subarray of memory cells and the another subarray of memory cells, the redundant column select line receiving a redundant column select signal for coupling the redundant group of columns of memory cells to one of the first or second groups of input/output lines, the redundant group of columns having a number of columns equal to the number of columns of memory cells in each of the first and second groups of columns of memory cells.

24. A method of replacing normal columns of memory cells with redundant columns of memory cells in a memory array including the steps of:

activating a row of memory cells in a subarray of the memory array;

activating a plurality of groups of columns of memory cells including at least one defective group of columns and at least one redundant group of columns in the subarray, each column including a memory cell in the row of memory cells;

addressing at least two groups of columns from the plurality of groups of columns in response to a column address signal;

producing a column select signal at a first time for connecting a selected group of columns, excluding the defective group of columns, to a respective group of input/output lines;

inhibiting production of a column select signal corresponding to the at least one defective group of columns; and producing a redundant column select signal at the first time for connecting the at least one redundant group of columns to a group of input/output lines corresponding to the at least one defective group of columns.

25. A method as in claim 24, further including the steps of:

selectively producing a plurality of true or complementary address bits in response to a predetermined address;

inhibiting production of a column select signal corresponding to the plurality of true or complementary address bits; and producing the second select signal in response to the plurality of true or complementary address bits.

26. A method as in claim 24, further including the step of activating a plurality of sense amplifiers, each corresponding to a respective column of memory cells, thereby activating the plurality of groups of columns.

27. A method as in claim 24, further including the step of applying a datum from the selected group of columns and the at least one redundant group of columns to a plurality of respective middle amplifiers.

28. A method as in claim 27, further including the step of activating the middle amplifiers at a second time for amplifying each respective datum on a data bus.

29. A method as in claim 24, wherein the step of producing a redundant column select signal at the first time includes producing two redundant column select signals at the first time for connecting two respective redundant groups of columns to two groups of input/output lines corresponding to two defective groups of columns.

30. A method as in claim 29, further including the step of inhibiting production of column select signals corresponding to two defective group of columns.

* * * * *